United States Patent
Shin et al.

(10) Patent No.: US 9,921,346 B2
(45) Date of Patent: Mar. 20, 2018

(54) OPTICAL FILMS FOR REDUCING COLOR SHIFT AND ORGANIC LIGHT-EMITTING DISPLAY APPARATUSES EMPLOYING THE SAME

(71) Applicant: Samsung Electronics Co., Ltd., Suwon-Si, Gyeonggi-Do (KR)

(72) Inventors: You-Min Shin, Chungcheongnam-do (KR); Hyun-Min Kim, Uiwang-si (KR); Hong-shik Shim, Seoul (KR); Young Oh, Uiwang-si (KR); Chul-Ho Jeong, Gwangju-si (KR); Eun-Young Cho, Chungcheongnam-do (KR)

(73) Assignees: Samsung Electronics Co., Ltd., Gyeonggi-do (KR); Cheil Industries, Inc., Gyeongsangbuk-do (KR)

(*) Notice: Subject to any disclaimer, the term of this patent is extended or adjusted under 35 U.S.C. 154(b) by 115 days.

(21) Appl. No.: 14/138,291

(22) Filed: Dec. 23, 2013

(65) Prior Publication Data

US 2014/0346469 A1    Nov. 27, 2014

(30) Foreign Application Priority Data

May 24, 2013  (KR) .................. 10-2013-0059267

(51) Int. Cl.
*H01L 51/52* (2006.01)
*G02B 5/02* (2006.01)
(Continued)

(52) U.S. Cl.
CPC ......... *G02B 5/0215* (2013.01); *G02B 5/0236* (2013.01); *G02B 5/0294* (2013.01); *H01L 27/3211* (2013.01); *H01L 51/5265* (2013.01); *H01L 51/5275* (2013.01); *G02B 5/3041* (2013.01); *H01L 51/5281* (2013.01)

(58) Field of Classification Search
CPC ............ H01L 27/3211; H01L 27/3232; H01L 51/5275; H01L 51/5281
See application file for complete search history.

(56) References Cited

U.S. PATENT DOCUMENTS 6,276,803 B1 * 8/2001 Aoyama ............... G02B 5/045
                                              348/E5.139
6,984,934 B2   1/2006 Moller et al.
(Continued)

FOREIGN PATENT DOCUMENTS

KR   10-0831374 B1   5/2008
KR   10-1217450 B1   4/2011
(Continued)

OTHER PUBLICATIONS

Korean Search Report dated Apr. 11, 2013.

*Primary Examiner* — Stephen Bradley
(74) *Attorney, Agent, or Firm* — Harness, Dickey & Pierce, P.L.C.

(57) ABSTRACT

Optical films for reducing color shift, and organic light-emitting display apparatuses, employing the same include a first lens pattern layer including a plurality of first grooves, and a second lens pattern layer on the first lens pattern layer having the plurality of first grooves. The second lens pattern layer has a plurality of second grooves crossing the plurality of first grooves. The plurality of first and second grooves are each shaped in the form of a stripe.

18 Claims, 6 Drawing Sheets

(51) Int. Cl.
*H01L 27/32* (2006.01)
*G02B 5/30* (2006.01)

(56) References Cited

U.S. PATENT DOCUMENTS

| | | | |
|---|---|---|---|
| 2002/0093284 A1* | 7/2002 | Adachi et al. | 313/506 |
| 2004/0061944 A1* | 4/2004 | Kashima | G02B 5/021 |
| | | | 359/599 |
| 2004/0080938 A1* | 4/2004 | Holman et al. | 362/231 |
| 2007/0153377 A1* | 7/2007 | Goto | 359/460 |
| 2008/0231780 A1* | 9/2008 | Graf | G02F 1/133606 |
| | | | 349/112 |
| 2008/0297906 A1 | 12/2008 | Takahashi et al. | |
| 2011/0198654 A1* | 8/2011 | Naya | H01L 51/5268 |
| | | | 257/98 |
| 2011/0233570 A1* | 9/2011 | Lee et al. | 257/88 |
| 2011/0240970 A1* | 10/2011 | Park et al. | 257/40 |
| 2012/0280894 A1* | 11/2012 | Park | 345/77 |
| 2014/0001448 A1* | 1/2014 | Naraoka | H01L 51/5275 |
| | | | 257/40 |

FOREIGN PATENT DOCUMENTS

| | | |
|---|---|---|
| KR | 10-1160557 B1 | 6/2012 |
| KR | 10-1165449 B1 | 7/2012 |

\* cited by examiner

OPTICAL FILMS FOR REDUCING COLOR SHIFT AND ORGANIC LIGHT-EMITTING DISPLAY APPARATUSES EMPLOYING THE SAME

CROSS-REFERENCE TO RELATED APPLICATIONS

This application claims the benefit of priority under 35 U.S.C. § 119 from Korean Patent Application No. 10-2013-0059267, filed on May 24, 2013, in the Korean Intellectual Property Office, the disclosure of which is incorporated herein by reference in its entirety.

BACKGROUND

1. Field

The present disclosure relates to optical films for reducing color shift and/or organic light-emitting display apparatuses employing the same.

2. Description of the Related Art

An organic light-emitting diode (OLED) is a self-luminescent device that includes an anode, an emission layer, and a cathode. Here, when a voltage is applied to the anode and the cathode, holes are injected from the anode into the emission layer, whereas electrons are injected from the cathode into the emission layer. Here, the holes and the electrons are recombined in the emission layer to thereby form excitons. As the excitons transit from an excited state to a ground state, light is emitted therefrom.

Because an emission material in an OLED is an organic material, the reduction of the lifespan of the OLED due to the deterioration of the organic material is a serious problem, and many techniques for resolving the reduction of the lifespan are being researched. From among these techniques, a technique using a microcavity structure may increase an intensity of light of a particular wavelength by resonating the light and emitting the light of the particular wavelength out of the microcavity structure, thereby reducing power consumption and improving color purity. In other words, in the microcavity structure, distances between anodes and cathodes are designed to respectively correspond to the representative wavelengths of red (R), green (G), and blue (G), so that only light of wavelengths corresponding thereto resonate and are emitted out of the microcavity structure, and lights of other wavelengths are weakened. As a result, lights emitted to the outside become more intense and sharp, and thus brightness and color purity are improved. Furthermore, such an increase in brightness may induce low power consumption to thus improve the lifespan of an OLED.

In such a microcavity structure, the wavelength to be amplified is determined based on a thickness of an organic light-emitting layer constituting an emission layer. Meanwhile, when an organic light-emitting device is viewed from a side, a length of a lateral light path differs from a length of a front light path. A change in the length of the light path has the same effect as a change in the thickness of the organic light-emitting layer, and thus a wavelength to be amplified is changed. In other words, as the viewing angle is titled from the front to a side, the maximum resonance wavelength becomes shorter, and thus a color shift occurs as the maximum resonance wavelength decreases. For example, even if a white color is embodied at the front, the white color may become bluish at a lateral side due to a blue shift phenomenon.

SUMMARY

Provided are optical films for reducing color shift and/or organic light-emitting display apparatuses employing the same.

According to some example embodiments, an optical film includes a first lens pattern layer including a plurality of first grooves, and a second lens pattern layer on the first lens pattern layer, the second lens pattern layer having a plurality of second grooves crossing the plurality of first grooves, wherein the plurality of first and second grooves are each shaped in the form of a stripe.

The first and second lens pattern layers may include materials having refractive indexes greater than 1, and depths of the plurality of first and second grooves are greater than widths of the plurality of first and second grooves.

Inner surfaces of the plurality of first and second grooves may be aspherical curved surfaces.

The plurality of first and second grooves may be filled with air or a filler having a smaller refractive index than refractive indexes of the first and second lens pattern layers.

The filler may include at least one of a light diffuser and a light absorber.

The optical film further may include at least one of a first filling layer on a surface of the first lens pattern layer in which the plurality of first grooves are formed, wherein the first filling layer includes a plurality of first protrusions each filling a respective one of the plurality of first grooves, and the first filling layer has a smaller refractive index than a refractive index of the first lens pattern layer; and a second filling layer on a surface of the second lens pattern layer in which the plurality of second grooves are formed, wherein the second filling layer includes a plurality of second protrusions each filling a respective one of the second grooves, and the second filling layer has a smaller refractive index than a refractive index of the second lens pattern layer.

The first and second filling layers may include at least one of a light diffuser and a light absorber.

The optical film further may include a circular polarization layer on the second lens pattern layer.

The circular polarization layer may include a phase converting layer and a linear polarization layer.

The optical film further may include a substrate layer between the second lens pattern layer and the circular polarization layer.

The substrate layer may include an optically isotropic material.

The optical film further may include an adhesive layer between the first lens pattern layer and the second lens pattern layer.

The optical film further may include an adhesive layer on the first lens pattern layer.

According to other example embodiments, an organic light-emitting display apparatus includes an organic light-emitting display panel including a plurality of emission layers each emitting a respective color, and an optical film connected to the organic light-emitting display panel, the optical film including a first lens pattern layer including a plurality of first grooves, and a second lens pattern layer on the first lens pattern layer, the second lens pattern layer having a plurality of second grooves crossing the plurality of first grooves. The plurality of first and second grooves are each shaped in the form of a stripe.

The organic light-emitting display panel may include a plurality of emission layers, and the plurality of emission layers each may have a microcavity structure configured to resonate and emit light of a corresponding wavelength.

The plurality of first and second grooves may be filled with air or a filler having a smaller refractive index than refractive indexes of the first and second lens pattern layers.

The organic light-emitting display apparatus further includes at least one of a first filling layer on a surface of the first lens pattern layer in which the plurality of first grooves are formed, wherein the first filling layer includes a plurality of first protrusions each filling a respective one of the plurality of first grooves, and the first filling layer has a smaller refractive index than a refractive index of the first lens pattern layer; and a second filling layer on a surface of the second lens pattern layer in which the plurality of second grooves are formed, wherein the second filling layer includes a plurality of second protrusions each filling a respective one of the plurality of second grooves, and the second filling layer has a smaller refractive index than a refractive index of the second lens pattern layer.

The organic light-emitting display apparatus may further include a circular polarization layer on the second lens pattern layer.

The organic light-emitting display apparatus further may include a substrate layer between the second lens pattern layer and the circular polarization layer.

A distance between the plurality of emission layers and the first lens pattern layer may be less than or equal to about 1.5 mm.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Figure 1A:
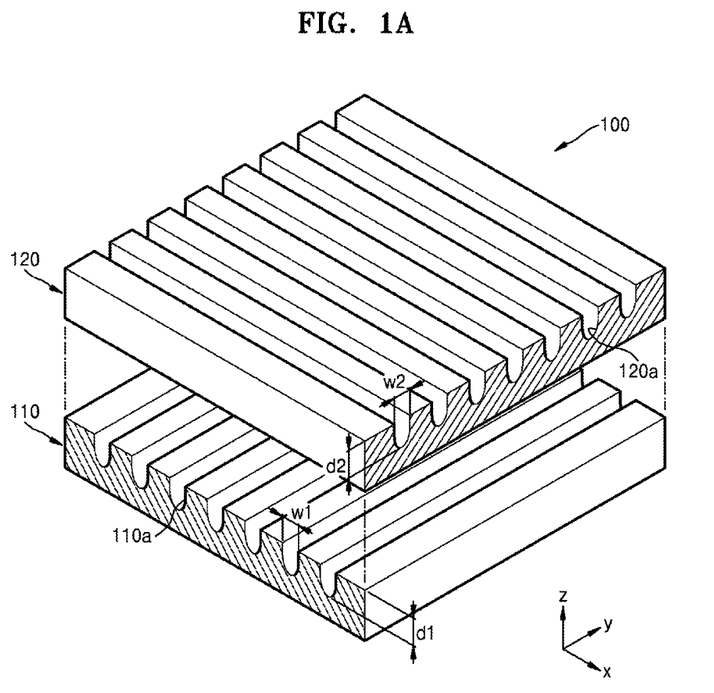
FIGS. 1A and 1B are an exploded perspective view and a sectional view of a color shift reducing optical film according to some example embodiments.
Figure 1B:
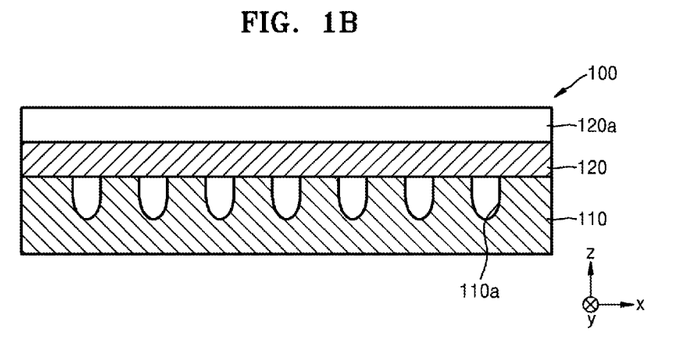

FIGS. 1A and 1B are an exploded perspective view and a sectional view of a color shift reducing optical film according to some example embodiments.

Referring to FIGS. FIGS. 1A and 1B, a color shift reducing optical film 100 includes a first lens pattern layer 110, which includes a plurality of first grooves 110a, and a second lens pattern layer 120, which is arranged on the first lens pattern layer 110 and includes a plurality of second grooves 120a. The first grooves 110a are formed at a constant interval in parallel to one another in the shape of stripes in a top surface of the first lens pattern layer 110. Here, the first grooves 110a may be formed in parallel to each other in a first direction. FIG. 1A shows an example that the first grooves 110a are formed extending in the y-axis direction.

A depth d1 of the first groove 110a may be greater than a width w1 of the first groove 110a. For example, an aspect ratio of the first grooves 110a may be from about 1 to about 3. However, the example embodiments are not limited thereto. Furthermore, an inner surface of the first groove 110a may include an aspherical curved surface to reduce (or, minimize) image distortion. For example, an inner surface of the first groove 110a may be an ellipsoid, a paraboloid, a hyperboloid, or any of various other curved surfaces. A ratio of the area occupied by the first grooves 110a in the first lens pattern layer 110 (that is, a ratio of the sum of widths w1 of the first grooves 110a with respect to the width of the first lens pattern layer 110) may be from about 25% to about 50%, for example. However, example embodiments are not limited thereto. The first grooves 110a may be filled with air or another gas having a refractive index less than 1.

The first lens pattern layer 110 may be formed of a highly-refractive material, e.g., a material having a refractive index greater than 1. The first lens pattern layer 110 may be formed of a transparent plastic material. However, example embodiments are not limited thereto, and the first lens pattern layer 110 may be formed of any of other various other materials. The first lens pattern layer 110 may further include at least one of a light diffuser (not shown) and a light absorber (not shown). The light diffuser improves visibility characteristics and may include diffusing beads, for example. Furthermore, the light absorber improves contrast or color purity by either selectively absorbing light of particular wavelengths or absorbing visible rays of all wavelengths, and may contain a black dye, e.g., carbon black.

The second lens pattern layer 120 is arranged on the top surface of the first lens pattern layer 110, in which the first grooves 110a are formed. The second grooves 120a are formed at a constant interval in parallel to one another in the shape of stripes in the top surface of the second lens pattern layer 120. Here, the second grooves 120a may be formed extending in a second direction, which crosses the first direction. In detail, the second grooves 120a are formed to cross the first grooves 110a perpendicularly, or at a set (or, predetermined) angle. FIG. 1A shows an example that the second grooves 120a are formed extending in the x-axis direction, which is perpendicular to the direction in which the first grooves 110a are formed. The set angle may, for example, be non-perpendicular (e.g., θ<90°) and non-parallel to the first direction in which the first grooves 110a extend.

Like the first groove 110a, the second groove 120a may be formed to have a depth d2 that is greater than its width w2. Furthermore, an inner surface of the second groove 120a may include an aspherical curved surface to reduce (or, minimize) image distortion. A ratio of the area occupied by the second grooves 120a in the second lens pattern layer 120 (that is, a ratio of the sum of widths w2 of the second grooves 120a with respect to the width of the second lens pattern layer 120) may be from about 25% to about 50%, for example. However, example embodiments are not limited thereto. The second grooves 120a may be filled with air. Like the first lens pattern layer 110, the second lens pattern layer 120 may be formed of a highly-refractive material, e.g., a material having a refractive index greater than 1. Furthermore, the second lens pattern layer 120 may further include at least one of a light diffuser (not shown) and a light absorber (not shown).

The first lens pattern layer 110 and/or the second lens pattern layer 120 may each include a lens pattern region (in which a set of the grooves (110a or 120a) are formed), and a non-pattern region having no pattern (or, no pattern of grooves). The lens pattern region and the non-pattern region may be alternately formed within a set period. The set period, a width of the lens pattern region, and a width of the non-pattern region may be determined in consideration of the arrangement of pixels of a display panel to which the optical film 100 is attached. The optical film 100 may be attached to the display panel having the arrangement of pixels in which an emission region and a non-emission region are alternately disposed. The widths of the lens pattern region and the non-pattern region and the set period may be determined so that the lens pattern region is disposed to face the emission region and that the non-pattern region is disposed to face at least a part of the non-emission region. An arrangement relationship between the optical film 100 and the display panel will be described below with reference to FIGS. 6 and 7.

The color shift reducing optical film 100 mixes lights by refracting and emitting lights, which are incident in a direction, in various directions according to points of incidences thereof.

Figure 2:
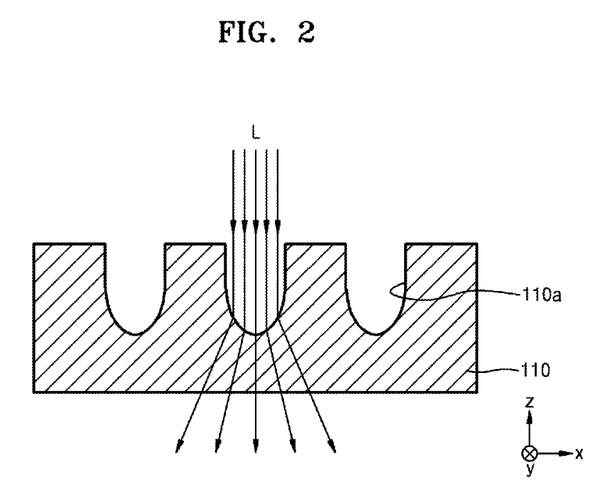
FIG. 2 shows a light path in which light that is perpendicularly incident to a first lens pattern layer of the color shift reducing optical film is emitted.
Figure 3:
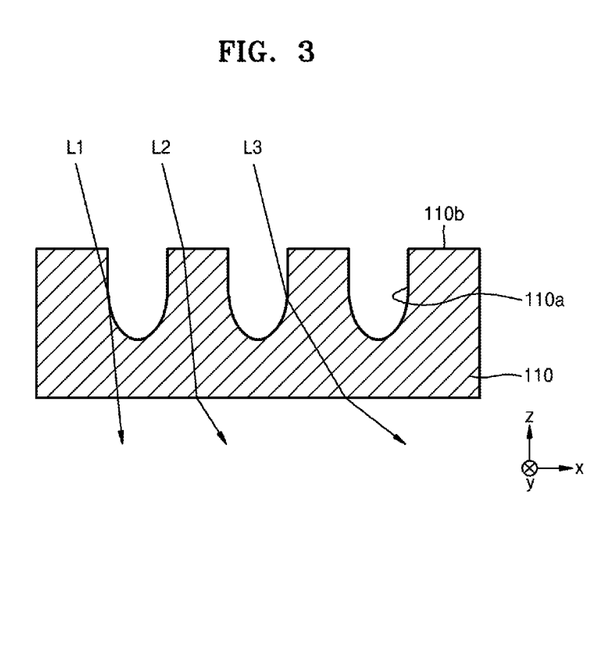
FIG. 3 shows a light path in which light that is incident to the first lens pattern layer at an angle is emitted.

In detail, FIG. 2 shows a light path in which light that is perpendicularly incident to the first lens pattern layer of the color shift reducing optical film is emitted, and FIG. 3 shows a light path in which light that is incident to the first lens pattern layer at an angle is emitted.

FIGS. 2 and 3 show an example in which the first grooves are formed in the first lens pattern layer in the first direction, that is, the y-axis direction.

Referring to FIG. 2, light that is perpendicularly incident to the first lens pattern layer 110 is refracted and emitted in any of various directions according to a point at which the light is incident into the first grooves 110a. In detail, light L that is perpendicularly incident to the first lens pattern layer 110 is refracted at any of various angles in the second direction, that is, the x-axis direction, as the light L is incident to the inner surface of the first grooves 110a. Therefore, light that is perpendicularly incident to the first lens pattern layer 110 is diffused in the x-axis direction as the light travels through the first grooves 110a.

Referring to FIG. 3, light that is incident to the first lens pattern layer 110 at an angle is also refracted and emitted at any of various angles in the second direction, that is, the x-axis direction, as the light L is incident to the inner surface of the first grooves 110a. In detail, first light L1 that is incident to a flat surface 110b of the first lens pattern layer 110 and contacts inner surfaces of the first grooves 110a is totally reflected by the inner surfaces and is emitted to the outside. Here, an angle of emission of the first light L1 exiting the first lens pattern layer 110 is smaller than the angle of incidence of the first light L1 to the first lens pattern layer 110. Furthermore, second light L2 that is incident to the flat surface 110b of the first lens pattern layer 110 and does not contact the inner surfaces of the first grooves 110a is refracted and emitted at the boundary between the first lens pattern layer 110 and outside. Here, an angle of refraction of the second light L2 exiting the first lens pattern layer 110 is greater than the angle of incidence of the second light L2 to the first lens pattern layer 110. Furthermore, third light L3 that is incident to the inner surfaces of the first grooves 110a is refracted at the inner surfaces and then refracted again and emitted at the boundary between the first lens pattern layer 110 and outside, wherein the third light L3 exits the first lens pattern layer 110 with a greater angle of refraction than that of the second light L2. As described above, the first, second, and third lights L1, L2, and L3 that are incident to the first lens pattern layer 110 at a same titled angle may be refracted and emitted at any of various angles in the second direction, that is, the x-axis direction according to their points of incidence. Therefore, light transmitted through the first lens pattern layer 110 may be light that is a mixture of lights incident to the first lens pattern layer 110 at various angles. A detailed example of light paths in which incident lights are diffused is given above. However, light paths vary according to a refractive index of the first lens pattern layer 110, an aspect ratio of the first grooves 110a, a shape of inner surfaces of the first grooves 110a, and a ratio of the area occupied by the first grooves 110a in the first lens pattern layer 110. As a result, the light mixture or brightness of emitted light may vary.

As described above, light incident to the first lens pattern layer 110, in which the first grooves 110a are formed in the first direction (the y-axis direction) may be emitted at any of various angles in the second direction (the x-axis direction), which is perpendicular to the first direction. Therefore, color shifts that may occur in the second direction (the x-axis direction) may be reduced. However, if only the first lens pattern layer 110 is used, color shifts that may occur in the second direction (the x-axis direction) may be reduced, but color shifts that may occur in other directions, e.g., the first direction (the y-axis direction) that is perpendicular to the second direction, will not be reduced. Therefore, to resolve the problem, the second lens pattern layer 120, in which the second grooves 120a are formed in a direction crossing the first grooves 110a, is formed on the first lens pattern layer 110. For example, if the second grooves 120a are formed in the second direction (the x-axis direction) to perpendicularly cross the first grooves 110a, light transmitted through the color shift reducing optical film 100 may be refracted and emitted at any of various angles in the first direction (the y-axis direction) and the second direction (the x-axis direction). Therefore, not only color shifts that may occur in the second direction (the x-axis direction), but also color shifts that may occur in the first direction (the y-axis direction) may be reduced. Although an example in which the first direction and the second direction are perpendicular to each other is provided above, example embodiments are not limited thereto. In other words, the first direction and the second direction may cross each other at a non-perpendicular angle. In this case, directions in which color shifts are significantly reduced may be changed.

Figure 4A:
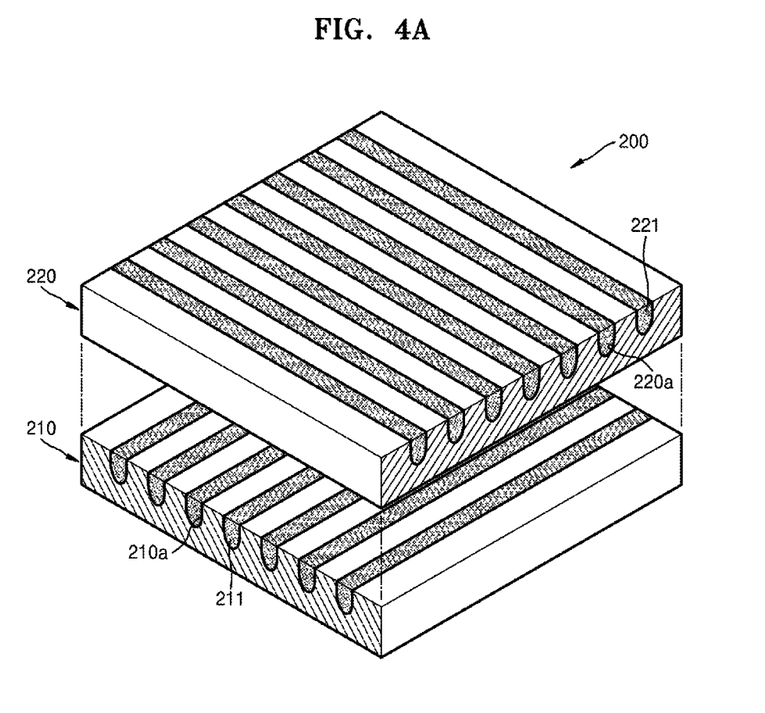
FIGS. 4A and 4B are an exploded perspective view and a sectional view of a color shift reducing optical film according to other example embodiments.
Figure 4B:
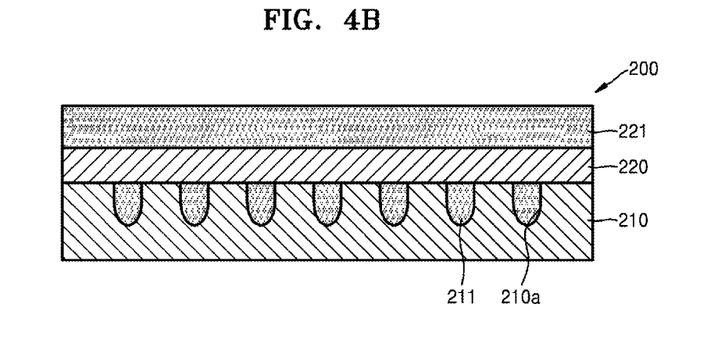

FIGS. 4A and 4B are an exploded perspective view and a sectional view of a color shift reducing optical film other example embodiments. Hereinafter, differences between the previous example embodiments and the present example embodiments will be described below.

Referring to FIGS. 4A and 4B, a color shift reducing optical film 200 includes a first lens pattern layer 210 and a second lens pattern layer 220, wherein the first lens pattern layer 210 includes a plurality of first grooves 210a and a first filler 211 that fills the first grooves 210a, and the second lens pattern layer 220 includes a plurality of second grooves 220a and a second filler 221 that fills the second grooves 220a. The first grooves 210a are formed in the shape of stripes in a top surface of first lens pattern layer 210. Here, the first grooves 210a may be formed in parallel to one another in the first direction. A depth of the first grooves 210a may be greater than a width of the first grooves 210a. For example, an aspect ratio of the first grooves 210a may be from about 1 to about 3. An inner surface of the first groove 210a may include an aspherical curved surface to reduce (or, minimize) image distortion. A ratio of the area occupied by the first grooves 210a in the first lens pattern layer 210 (that is, a ratio of the sum of widths of the first grooves 210a with respect to the width of the first lens pattern layer 210) may be from about 25% to about 50%, for example.

The first lens pattern layer 210 may be formed of a highly-refractive material, e.g., a material having a refractive index greater than 1. Furthermore, the first lens pattern layer 210 may further include at least one of a light diffuser (not shown) and a light absorber (not shown). The light diffuser may include diffusing beads, for example. Furthermore, the light absorber may contain a black dye, e.g., carbon black. The first grooves 210a are filled with the first filler 211. Here, the first filler 211 may be formed of a material having a refractive index smaller than that of the first lens pattern layer 210. For example, the first filler 211 may be formed of a resin. However, example embodiments are not limited thereto. For example, according to other example embodiments, the first lens pattern layer 210 and/or the refractive index of the second lens pattern layer 220 may have a refractive index other than 1 but higher than the refractive indexes of the first and second fillers 211 and 221, respectively. The first filler 211 may further include at least one of a light diffuser and a light absorber. The light diffuser may include diffusing beads, for example. Furthermore, the light absorber may contain a black dye, e.g., carbon black.

The second lens pattern layer 220 is formed on the top surface of the first lens pattern layer 210, in which the first grooves 210a are formed. The second grooves 220a are formed at a constant interval in parallel to one another in the shape of stripes in a top surface of the first lens pattern layer 210. Here, the second grooves 220a may be formed in the second direction that crosses the first direction. In detail, the second grooves 220a are formed to cross the first grooves 210a perpendicularly, or at a set (or, predetermined) angle. Like the first grooves 210a, a depth of the second grooves 220a may be greater than a width of the second grooves 220a. Furthermore, an inner surface of the first groove 210a may include an aspherical curved surface to reduce (or, minimize) image distortion. A ratio of the area occupied by the second grooves 220a in the second lens pattern layer 220 (that is, a ratio of the sum of widths of the second grooves 220a with respect to the width of the second lens pattern layer 220) may be from about 25% to about 50%, for example. Like the first lens pattern layer 210, the second lens pattern layer 220 may be formed of a highly-refractive material, e.g., a material having a refractive index greater than 1. Furthermore, the second lens pattern layer 220 may further include at least one of a light diffuser and a light absorber. The second grooves 220a are filled with the second filler 221. Here, the second filler 221 may be formed of a material having a refractive index smaller than that of the second lens pattern layer 220. For example, the second filler 221 may be formed of a resin. However, example embodiments are not limited thereto. The second filler 221 may further include at least one of a light diffuser and a light absorber.

The color shift reducing optical film 200 described above is identical to the color shift reducing optical film 100 described above except that the first grooves 210a and the second grooves 220a are filled with the first filler 211 and the second filler 221, respectively. Therefore, the color shift reducing optical film 200 according to the present example embodiments may reduce color shifts in various directions.

Figure 5A:
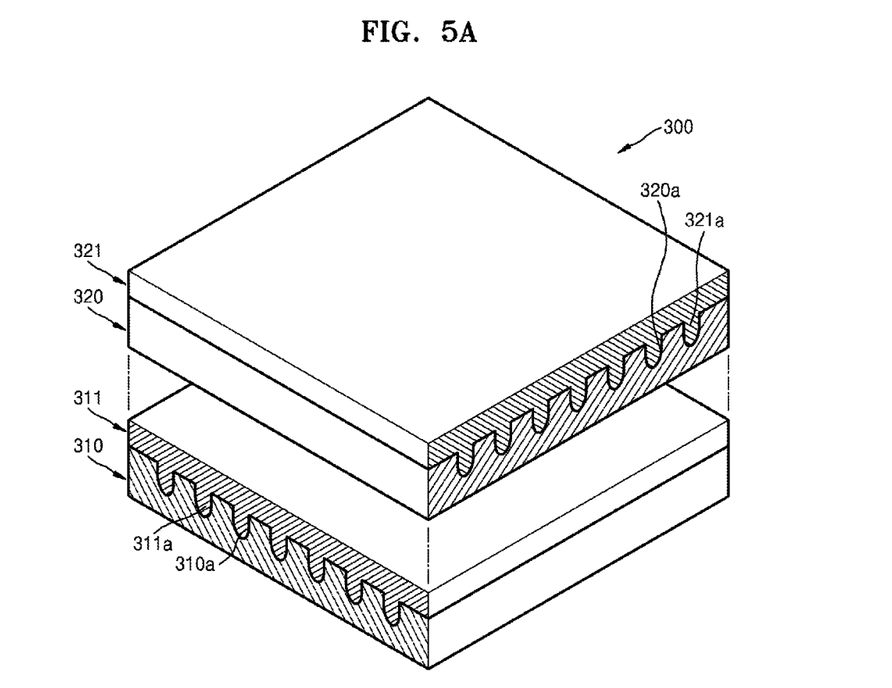
FIGS. 5A and 5B are a perspective view and a sectional view of a color shift reducing optical film according to further example embodiments.
Figure 5B:
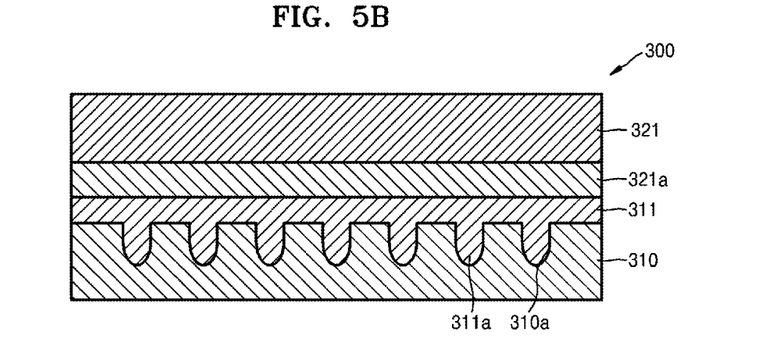

FIGS. 5A and 5B are a perspective view and a sectional view of a color shift reducing optical film according to further example embodiments. Hereinafter, differences between the previous example embodiments and the present example embodiments will be described below.

Referring to FIGS. 5A and 5B, a color shift reducing optical film 300 includes a first lens pattern layer 310 having a plurality of first grooves 310a, a first filling layer 311 arranged on the first lens pattern layer 310, a second lens pattern layer 320, which is arranged on the first filling layer 311 and includes a plurality of second grooves 320a, and a second filling layer 321 arranged on the second lens pattern layer 320. The first grooves 310a are formed in the shape of stripes in a top surface of the first lens pattern layer 310. Here, the first grooves 310a may be formed in parallel to one another in the first direction. A depth of the first grooves 310a may be greater than a width of the first grooves 310a. For example, an aspect ratio of the first grooves 310a may be from about 1 to about 3. An inner surface of the first groove 310a may include an aspherical curved surface to reduce (or, minimize) image distortion. A ratio of the area occupied by the first grooves 310a in the first lens pattern layer 310 (that is, a ratio of the sum of widths of the first grooves 310a with respect to the width of the first lens pattern layer 310) may be from about 25% to about 50%, for example. The first lens pattern layer 310 may be formed of a highly-refractive material, e.g., a material having a refractive index greater than 1. Furthermore, the first lens pattern layer 310 may further include at least one of a light diffuser (not shown) and a light absorber (not shown). The light diffuser may include diffusing beads, for example. Furthermore, the light absorber may contain a black dye, e.g., carbon black.

The first filling layer 311 is arranged to cover the top surface of the first lens pattern layer 310 in which the first grooves 310a are formed. The first filling layer 311 includes a plurality of first protrusions 311a that fill the first grooves 310a. Therefore, the first protrusions 311a may have a stripe-like shape corresponding to the first grooves 310a. The first filling layer 311 may be formed of a material having a refractive index smaller than that of the first lens pattern layer 310. For example, the first filling layer 311 may be formed of a resin. However, example embodiments are not limited thereto. The first filling layer 311 may further include at least one of a light diffuser and a light absorber. The light diffuser may include diffusing beads, for example. Furthermore, the light absorber may contain a black dye, e.g., carbon black.

The second lens pattern layer 320 is formed on the top surface of the first filling layer 311. The second grooves 320a are formed at a constant interval in parallel to one another in the shape of stripes in the top surface of the second lens pattern layer 320. Here, the second grooves 320a may be formed in the second direction that crosses the first direction. In detail, the second grooves 320a are formed to cross the first grooves 310a perpendicularly, or at a set (or, predetermined) angle. Like the first grooves 310a, a depth of the second grooves 320a may be greater than a width of the second grooves 320a. Furthermore, an inner surface of the first groove 310a may include an aspherical curved surface to reduce (or, minimize) image distortion. A ratio of the area occupied by the second grooves 320a in the second lens pattern layer 320 (that is, a ratio of the sum of widths of the second grooves 320a with respect to the width of the second lens pattern layer 320) may be from about 25% to about 50%, for example. Like the first lens pattern layer 310, the second lens pattern layer 320 may be formed of a highly-refractive material, e.g., a material having a refractive index greater than 1. Furthermore, the second lens pattern layer 320 may further include at least one of a light diffuser and a light absorber.

The second filling layer 321 is arranged to cover the top surface of the second lens pattern layer 320 in which the second grooves 320a are formed. The second filling layer 321 includes a plurality of second protrusions 321a that respectively fill the second grooves 320a. Therefore, the second protrusions 321a may have a stripe-like shape in correspondence to the second grooves 320a. The second filling layer 321 may be formed of a material having a refractive index smaller than that of the second lens pattern layer 320. For example, the second filling layer 321 may be formed of a resin. However, example embodiments are not limited thereto. The second filling layer 321 may further include at least one of a light diffuser and a light absorber. The light diffuser may include diffusing beads, for example. Furthermore, the light absorber may contain a black dye, e.g., carbon black.

The color shift reducing optical film 300 as described above is identical to the color shift reducing optical film 100 and the color shift reducing optical film 200 according to the previous example embodiments described above except that the first filling layer 311 and the second filling layer 321, which fill the first grooves 310a and the second grooves 320a and are formed of materials with low refractive indexes, are arranged on the first lens pattern layer 310 and the second lens pattern layer 320. Therefore, the color shift reducing optical film 300 may reduce color shifts in various directions. When an optical film having the structure described above is applied to an organic light-emitting display apparatus, not only horizontal color shifts may be reduced, but also vertical color shifts may be reduced.

Figure 6:
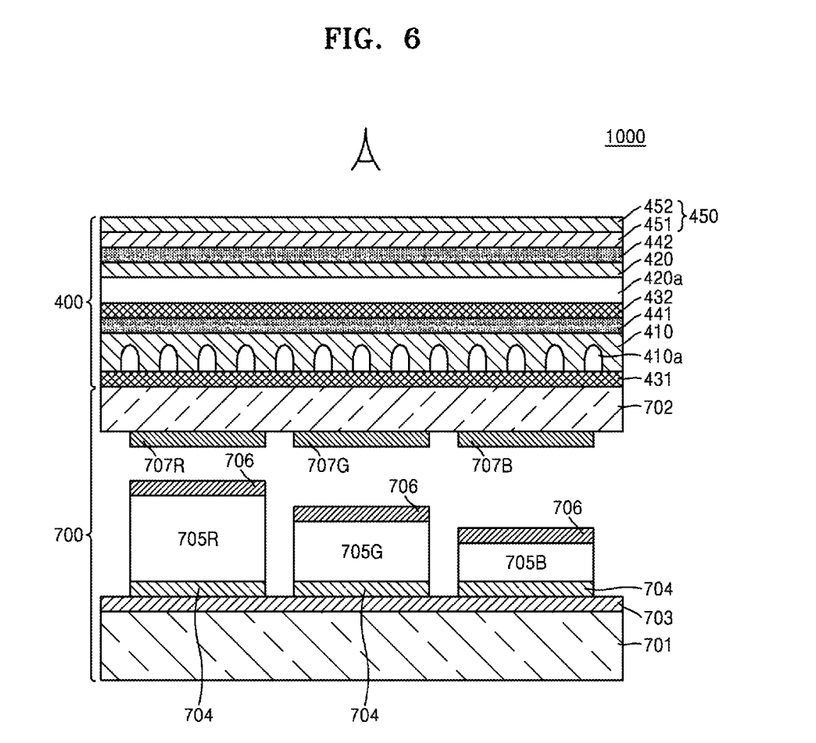
FIG. 6 is a sectional view of an organic light-emitting display apparatus according to some example embodiments.

FIG. 6 is a sectional view of an organic light-emitting display apparatus according to some example embodiments.

In FIG. 6, an optical film employed by the organic light-emitting display apparatus according to the present example embodiments has a configuration of the color shift reducing optical film 100, 200, or 300, in addition to an adhesive layer, a circular polarization layer, etc. that are necessary for applying the optical film to the organic light-emitting display apparatus.

Referring to FIG. 6, an organic light-emitting display apparatus 1000 includes an organic light-emitting panel 700 and an optical film 400 arranged on the organic light-emitting panel 700. The organic light-emitting panel 700 includes a plurality of pixels, where each of the pixels includes a plurality of sub-pixels having different colors. For convenience of explanation, FIG. 6 shows only one pixel of the organic light-emitting panel 700, where the pixel includes a red sub-pixel, a green sub-pixel, and a blue sub-pixel. Emission devices having different colors corresponding to the sub-pixels constitute a pixel. The emission devices includes anodes 704, emission layers 705R, 705G, and 705B having set (or, predetermined) colors, and cathodes 706, respectively. Here, each of the emission layers 705R, 705G, and 705B emits lights of respective (or, predetermined) colors (e.g., red, green, or blue). FIG. 6 shows the red, green, and blue emission layers 705R, 705G, and 705B.

The organic light-emitting panel 700 has a microcavity structure for improving brightness and color purity. In other words, the emission layers 705R, 705G, and 705B emit lights of different wavelengths and have a microcavity structure which resonates lights of corresponding wavelengths.

For example, as shown in FIG. 6, if a pixel of the organic light-emitting panel 700 consists of red, green, and blue emission devices, the distance between the anode 704 and the cathode 706 of a red emission device emitting red light, which has relatively the longest wavelength, is relatively the longest, whereas the distance between the anode 704 and the cathode 706 of a blue emission device emitting blue light, which has relatively the shortest wavelength, is relatively the shortest. In the organic light-emitting panel 700 having a microcavity structure, distances between anodes and cathodes are designed (or, configured) to correspond to the respective representative wavelengths of the red, green, and blue light. As a result, only lights of colors corresponding thereto are resonated and emitted to the outside, whereas lights of the other colors are weakened.

The structure of the organic light-emitting panel 700 will be described in closer detail. The organic light-emitting panel 700 includes first and second substrates 701 and 702 that are arranged apart from each other and emission devices of different colors that are arranged between the first and second substrates 701 and 702. The emission devices may be red, green, and blue emission devices, for example. However, example embodiments are not limited thereto, and the emission devices may be red, green, blue, and white emission devices. The emission devices include the anodes 704 and the cathodes 706 that are arranged apart from each other and emission layers 705R, 705G, and 705B of respective (or, predetermined colors) (e.g., red, green, and blue) that are arranged between the anodes 704 and the cathodes 706, respectively.

The anode 704 may be formed of a non-transparent metal, e.g., aluminum (Al). Furthermore, the cathode 706 may be formed as an oxide transparent electrode, e.g., ITO, or a semitransparent electrode, e.g., a Ni thin-film, for transmission of lights emitted by the emission layers 705R, 705G, and 705B. When a forward voltage is applied between the anode 704 and the cathode 706, holes are injected to the emission layers 705R, 705G, and 705B from the anode 704, whereas electrons are injected to the emission layers 705R, 705G, and 705B from the cathode 706. The holes and the electrons injected into the emission layers 705R, 705G, and 705B are combined and generate excitons, and lights of respective (or, predetermined colors) are emitted as the excitons transit from an excited state to a ground state, where the brightness of emitted light is proportional to an amount of current flowing between the anode 704 and the cathode 706. At least one from among a hole injection layer, a hole transport layer, an electron transport layer, and an electron injection layer may be further arranged between the anode 704 and the cathode 706 to improve emission efficiency.

A driving circuit unit 703 for driving the emission devices may be arranged on the first substrate 701. The driving circuit unit 703 may include at least two thin-film transistors (TFTs) (not shown) and capacitors (not shown) for each of the emission devices. The brightness of a set (or, predetermined) emission device is controlled by controlling an amount of current supplied to the emission device by using data signals. The organic light-emitting panel 700 may further include color filters 707R, 707G, and 707B having different colors to improve color efficiency. The color filters 707R, 707G, and 707B may be formed on the second substrate 702. FIG. 6 shows a case in which the red, green, and blue color filters 707R, 707G, and 707B corresponding to red, green, and blue emission devices are formed on the rear surface of the second substrate 702. If a pixel of the organic light-emitting panel 700 consists of red, green, blue, and white emission devices, no color filter corresponding to the white emission device may be arranged. Furthermore, although not shown, a black matrix for preventing light leakage and color mixture may be further arranged between sub-pixels on the second substrate 702.

In the organic light-emitting panel 700 employing a microcavity structure, as the viewing angle is titled from the front to a side, the maximum resonance wavelength becomes shorter, and thus color shift occurs as the maximum resonance wavelength decrease. For example, even if a white color is embodied at the front, the white color may become bluish at a lateral side due to blue shift phenomenon. To resolve the problem, the optical film 400 is arranged on (or, operatively connected to) the organic light-emitting panel 700 in the present example embodiments.

The optical film 400 includes a first lens pattern layer 410, a second lens pattern layer 420, and a circular polarization layer 450 that are arranged on the organic light-emitting panel 700 in the order stated. The optical film 400 may further include a first adhesive layer 431 arranged between the second substrate 702 and the first lens pattern layer 410. The first adhesive layer 431 may include a pressure sensitive adhesion (PSA) material, for example. However, example embodiments are not limited thereto. The first adhesive layer 431 may include at least one of a light diffuser and a light absorber. The light diffuser improves visibility characteristics and may include diffusing beads, for example. Furthermore, the light absorber improves contrast or color purity by either selectively absorbing light of particular wavelengths or absorbing visible rays of all wavelengths, and may contain a black dye, e.g., carbon black.

The first lens pattern layer 410, including a plurality of first grooves 410a, is formed on the top surface of the first adhesive layer 431. The first grooves 410a are formed in the rear surface of the first lens pattern layer 410 to a predetermined depth. The first lens pattern layer 410 has the same configuration as the first lens pattern layer 110 shown in FIGS. 1A and 1B. The first grooves 410*a* are formed in parallel to one another in the shape of stripes in the rear surface of the first lens pattern layer 410. Here, a depth of the first groove 410*a* may be greater than a width of the first groove 410*a*. For example, an aspect ratio of the first grooves 410*a* may be from about 1 to about 3. However, example embodiments are not limited thereto. Furthermore, an inner surface of the first groove 410*a* may include an aspherical curved surface to reduce (or, minimize) image distortion. For example, an inner surface of the first groove 410*a* may be an ellipsoid, a paraboloid, a hyperboloid, or any of various other curved surfaces. A ratio of the area occupied by the first grooves 410*a* in the first lens pattern layer 410 (that is, a ratio of the sum of widths of the first grooves 410*a* with respect to the width of the first lens pattern layer 410) may be from about 25% to about 50%, for example. However, example embodiments are not limited thereto. The first grooves 410*a* may be filled with air.

The first lens pattern layer 410 may be formed of a highly-refractive material, e.g., a material having a refractive index greater than 1. The first lens pattern layer 410 may be formed of a transparent plastic material. However, example embodiments are not limited thereto, and the first lens pattern layer 410 may be formed of any of various other materials. The first lens pattern layer 410 may further include at least one of a light diffuser and a light absorber. The first grooves 410*a* may be filled with the first filler (211 of FIG. 4*a*) having a refractive index smaller than that of the first lens pattern layer 410. Here, the first filler may be formed of a resin. However, example embodiments are not limited thereto. The first filler may further include at least one of a light diffuser and a light absorber.

A first substrate layer 441 may be further arranged on the top surface of the first lens pattern layer 410. The first substrate layer 441 may be formed of an optically isotropic material. For example, the first substrate layer 441 may be formed of triacetyl cellulose (TAC). However, example embodiments are not limited thereto. Furthermore, a second adhesive layer 432 may be further arranged on the first substrate layer 441. The second adhesive layer 432 may include a PSA (Pressure Sensitive Adhesive) material. However, example embodiments are not limited thereto. The second adhesive layer 432 may further include at least one of a light diffuser and a light absorber.

The second lens pattern layer 420, including a plurality of second grooves 420*a*, is arranged on the top surface of the second adhesive layer 432. The second grooves 420*a* are formed in the rear surface of the second lens pattern layer 420 to a set (or, predetermined) depth. The second lens pattern layer 420 has the same configuration as the second lens pattern layer 120 shown in FIGS. 1A and 1B. The second grooves 420*a* are formed in parallel to one another in the shape of stripes in the rear surface of the second lens pattern layer 420. Here, the second grooves 420*a* may be formed in the second direction that crosses the first direction. In detail, the second grooves 420*a* are formed to cross the first grooves 410*a* perpendicularly, or at a set (or, predetermined) angle. Like the first grooves 410*a*, a depth of the second groove 420*a* may be greater than a width of the second groove 420*a*. Furthermore, an inner surface of the second groove 420*a* may include an aspherical curved surface to reduce (or, minimize) image distortion. A ratio of the area occupied by the second grooves 420*a* in the second lens pattern layer 420 (that is, a ratio of the sum of widths of the second grooves 420*a* with respect to the width of the second lens pattern layer 420) may be from about 25% to about 50%, for example. However, example embodiments are not limited thereto. The second grooves 420*a* may be filled with air.

Like the first lens pattern layer 410, the second lens pattern layer 420 may be formed of a highly-refractive material, e.g., a material having a refractive index greater than 1. The second lens pattern layer 420 may further include at least one of a light diffuser and a light absorber. The second grooves 420*a* may be filled with the second filler (221 of FIG. 4*a*) having a refractive index smaller than that of the second lens pattern layer 420. The second filler may further include at least one of a light diffuser and a light absorber. A second substrate layer 442 may be further arranged on the top surface of the second lens pattern layer 420. The second substrate layer 442 may be formed of an optically isotropic material, e.g., TAC. However, example embodiments are not limited thereto.

The circular polarization layer 450 may be arranged on the top surface of the second substrate layer 442. The circular polarization layer 450 may include a linear polarization layer 452 and a phase converting layer 451. The linear polarization layer 452 may include a TAC film and a polyvinyl alcohol (PVA) film, for example. In detail, the linear polarization layer 452 may have a TAC film/PVA film/TAC film stacked structure. Here, the PVA film is a film for polarizing lights and may be formed by attaching a dichroic pigment to a PVA, which is a polymer. Furthermore, the TAC films arranged on both surfaces of the PVA film support the PVA film. The linear polarization layer 452 may have any of various stacked structures other than the stacked structure described above. The phase converting layer 451 may include a λ/4 phase difference film. The circular polarization layer 450 reduces reflection of external light, thereby improving visibility. Although FIG. 6 shows that the linear polarization layer 452 and the phase converting layer 451 are formed on the top surface of the second lens pattern layer 420, the linear polarization layer 452 and the phase converting layer 451 may also be arranged between the organic light-emitting panel 700 and the first lens pattern layer 410. Furthermore, the first lens pattern layer 410 and the second lens pattern layer 420 may be arranged between the linear polarization layer 452 and the phase converting layer 451. Although the optical film 400 is arranged to reduce color shifts based on viewing angles, image distortion may occur therefrom. Therefore, to reduce (or, minimize) image distortion, a distance between the emission layers 705R, 705G, and 705B and the first lens pattern layer 410 may be less than or equal to about 1.5 mm.

As described above, the first lens pattern layer 410 and the second lens pattern layer 420 mix lights incident to the optical film 400 by using the first grooves 410*a* and the second grooves 420*a*, which cross each other at a set (or, predetermined) angle, and emit the mixed light to the outside at various angles. Therefore, horizontal and vertical color shifts of an organic light-emitting display apparatus may be reduced.

Figure 7:
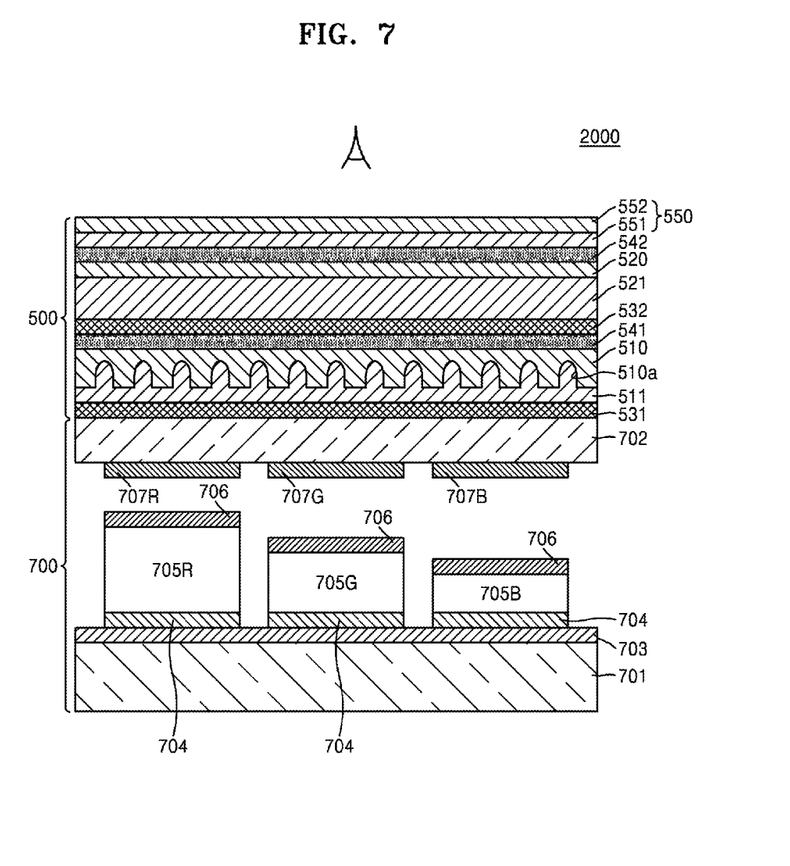
FIG. 7 is a sectional view of an organic light-emitting display apparatus according to other example embodiments.

FIG. 7 is a sectional view of an organic light-emitting display apparatus according to other example embodiments.

The organic light-emitting display apparatus shown in FIG. 7 is identical to the organic light-emitting display apparatus shown in FIG. 6, except that the organic light-emitting display apparatus shown in FIG. 7 further comprises first and second filler layers. Hereinafter, differences between the previous example embodiments and the present example embodiments will be described below.

Referring to FIG. 7, an organic light-emitting display apparatus 2000 includes the organic light-emitting panel 700 and an optical film 500 arranged on the organic light-emitting panel 700. Because the detailed description of the organic light-emitting panel 700 is given above in the previous example embodiments, a description thereof is omitted below. The optical film 500 includes the first filling layer 511, a first lens pattern layer 510, the second filling layer 521, a second lens pattern layer 520, and a circular polarization layer 550 that are arranged on the organic light-emitting panel 700 in the order stated. The optical film 500 may further include a first adhesive layer 531, which is arranged between the second substrate 702 and the first filling layer 511. The first adhesive layer 531 may include a PSA material. However, example embodiments are not limited thereto. The first adhesive layer 531 may further include at least one of a light diffuser and a light absorber.

The first filling layer 511 and the first lens pattern layer 510 are arranged on the first adhesive layer 531 in the order stated. A plurality of first grooves 510a are formed in the shape of stripes in the rear surface of first lens pattern layer 510 to a set (or, predetermined) depth. The first lens pattern layer 510 has the same configuration as the first lens pattern layer 110 shown in FIGS. 1A and 1B. In other words, the first grooves 510a may be formed in the shape of stripes in the rear surface of the first lens pattern layer 510 in parallel to one another in the first direction. The first lens pattern layer 510 may be formed of a highly-refractive material, e.g., a material having a refractive index greater than 1. Furthermore, the first lens pattern layer 510 may further include at least one of a light diffuser and a light absorber.

The first filling layer 511 is arranged to cover the rear surface of the first lens pattern layer 510, in which the first grooves 510a are formed. The first filling layer 511 includes a plurality of first protrusions (311 a of FIG. 5A) that fill the first grooves 510a. The first filling layer 511 may be formed of a material having a refractive index smaller than that of the first lens pattern layer 510. For example, the first filling layer 511 may be formed of a resin. However, example embodiments are not limited thereto. The first filling layer 511 may further include at least one of a light diffuser and a light absorber. A first substrate layer 541 may be further arranged on the top surface of the first lens pattern layer 510, and a second adhesive layer 532 may be further arranged on the top surface of the first substrate layer 541. The first substrate layer 541 may be formed of an optically isotropic material, whereas the second adhesive layer 532 may include a PSA material. The second adhesive layer 532 may further include at least one of a light diffuser and a light absorber.

The second filling layer 521 and the second lens pattern layer 520 are arranged on the second adhesive layer 532 in the order stated. A plurality of second grooves 520a are formed in the shape of stripes in the rear surface of the second lens pattern layer 520 to a set (or, predetermined) depth. The second lens pattern layer 520 has the same configuration as the first lens pattern layer 210 shown in FIGS. 1A and 1B. The second grooves 520a are formed in the shape of stripes in the rear surface of the second lens pattern layer 520 to a set (or, predetermined) depth. Here, the second grooves 520a may be formed in the second direction that crosses the first direction. In detail, the second grooves 520a are formed to cross the first grooves 510a perpendicularly, or at a set (or, predetermined) angle). Like the first grooves 510a, a depth of the second grooves 520a may be greater than a width of the second grooves 520a. Furthermore, the second lens pattern layer 520 may further include at least one of a light diffuser and a light absorber.

The second filling layer 521 is arranged to cover the rear surface of the second lens pattern layer 520 in which the second grooves 520a are formed. The second filling layer 521 includes a plurality of first protrusions (311a of FIG. 5A) that respectively fill the second grooves 520a. The second filling layer 521 may be formed of a material having a refractive index smaller than that of the second lens pattern layer 520. The second filling layer 521 may further include at least one of a light diffuser and a light absorber. A second substrate layer 542 may be further arranged on the top surface of the second lens pattern layer 520. The second substrate layer 542 may be formed of an optically isotropic material.

The circular polarization layer 550 may be arranged on the top surface of the second substrate layer 542. The circular polarization layer 550 may include a linear polarization layer 552 and a phase converting layer 551. The linear polarization layer 552 may include a TAC film and a PVA film, for example. The phase converting layer 551 may include a λ/4 phase difference film, for example. Although FIG. 7 shows that the linear polarization layer 552 and the phase converting layer 551 are formed on the top surface of the second lens pattern layer 520, the linear polarization layer 552 and the phase converting layer 551 may also be arranged between the organic light-emitting panel 700 and the first filling layer 511. Furthermore, the first lens pattern layer 510 and the second lens pattern layer 520 may be arranged between the linear polarization layer 552 and the phase converting layer 551. To reduce (or, minimize) image distortion, a distance between the emission layers 705R, 705G, and 705B and the first lens pattern layer 510 may be less than or equal to about 1.5 mm. In the structure as described above, the first lens pattern layer 510 and the second lens pattern layer 520, which includes the first and second grooves 510a and 520a and are formed of materials with high refractive indexes, mix lights incident to the optical film 500 by using the first filling layer 511 and the second filling layer 521, which fill the first and second grooves 510a and 520a and are formed of materials with low refractive indexes, and emit the mixed light to the outside at various angles. Therefore, horizontal and vertical color shifts of an organic light-emitting display apparatus may be reduced.

According to the above example embodiments, as an optical film includes first and second lens pattern layers including first and second grooves that are formed in the shape of stripes in directions that cross each other, lights of respective (or, predetermined) colors that are emitted by an organic light-emitting panel and are incident to the optical film are refracted in various directions and emitted to the outside. As a result, horizontal color shifts and vertical color shifts in an organic light-emitting display apparatus may be reduced.

It should be understood that the example embodiments described therein should be considered in a descriptive sense only and not for purposes of limitation. Descriptions of features within each example embodiment should typically be considered as available for other similar features in other example embodiments.

What is claimed is:
1. An optical film, comprising:
   a first lens pattern layer including a first surface having a plurality of first grooves formed in a first direction and flat surfaces between the plurality of first grooves, and a second surface opposite to the first surface;
   a second lens pattern layer on the first lens pattern layer, the second lens pattern layer including a first surface having a plurality of second grooves formed in a second direction crossing the first direction and flat surfaces between the plurality of second grooves, and a second surface opposite to the first surface, the second surface of the first lens pattern layer facing the first surface of the second lens pattern layer, a first filling layer on the first surface of the first lens pattern layer, the first filling layer having a flat upper surface, the first filling layer including a flat portion and a plurality of first protrusions, the plurality of first protrusions protruding from the flat portion of the first filling layer and filling the plurality of first grooves, respectively, the first filling layer having a smaller refractive index than a refractive index of the first lens pattern layer; and a second filling layer on the first surface of the second lens pattern layer, the second filling layer having a flat upper surface, the second filling layer including a flat portion and a plurality of second protrusions, the plurality of first protrusions protruding from the flat portion of the second filling layer and filling the plurality of second grooves, respectively, the second filling layer having a smaller refractive index than a refractive index of the second lens pattern layer, wherein each of the plurality of first grooves and each of the plurality of second grooves are in a form of a stripe, and the plurality of first grooves and the plurality of second grooves are filled with the first filling layer and the second filling layer, respectively, the first filling layer and the second filling layer being a transparent material, such that light rays incident to the first surface of the second lens pattern layer are emitted through the second surface of the second lens pattern layer at various angles in the first direction, according to respective points at which the light rays are incident, and the light rays emitted from the second surface of the second lens pattern layer and incident to the first surface of the first lens pattern layer are emitted through the second surface of the first lens pattern layer at various angles in the second direction, according to respective points at which the light rays are incident.

2. The optical film of claim 1, wherein
the first and second lens pattern layers include materials having refractive indexes greater than 1, and
depths of the plurality of first and second grooves are greater than widths of the plurality of first and second grooves.

3. The optical film of claim 1, wherein inner surfaces of the plurality of first and second grooves are aspherical curved surfaces.

4. The optical film of claim 1, wherein the first and second filling layers are air or a filler having a smaller refractive index than refractive indexes of the first and second lens pattern layers.

5. The optical film of claim 4, wherein the filler includes a light diffuser.

6. The optical film of claim 1, wherein the first and second filling layers include a light diffuser.

7. The optical film of claim 1, further comprising:
a circular polarization layer on the second lens pattern layer.

8. The optical film of claim 7, wherein the circular polarization layer includes a phase converting layer and a linear polarization layer.

9. The optical film of claim 7, further comprising:
a substrate layer between the second lens pattern layer and the circular polarization layer.

10. The optical film of claim 9, wherein the substrate layer includes an optically isotropic material.

11. The optical film of claim 7, further comprising:
an adhesive layer between the first lens pattern layer and the second lens pattern layer.

12. The optical film of claim 7, further comprising:
an adhesive layer on the first lens pattern layer.

13. An organic light-emitting display apparatus, comprising:
an organic light-emitting display panel including a plurality of emission layers each emitting a respective color; and
an optical film connected to the organic light-emitting display panel, the optical film including,
a first lens pattern layer including a first surface having a plurality of first grooves formed in a first direction and flat surfaces between the plurality of first grooves, and a second surface opposite to the first surface, and
a second lens pattern layer on the first lens pattern layer, the second lens pattern layer including a first surface having a plurality of second grooves formed in a second direction crossing the first direction and flat surfaces between the plurality of second grooves, and a second surface opposite to the first surface, the second surface of the first lens pattern layer facing the first surface of the second lens pattern layer,
a first filling layer on the first surface of the first lens pattern layer, the first filling layer having a flat upper surface, the first filling layer including a flat portion and a plurality of first protrusions, the plurality of first protrusions protruding from the flat portion of the first filling layer and filling the plurality of first grooves, respectively, the first filling layer having a smaller refractive index than a refractive index of the first lens pattern layer; and
a second filling layer on the first surface of the second lens pattern layer, the second filling layer having a flat upper surface, the second filling layer including a flat portion and a plurality of second protrusions, the plurality of first protrusions protruding from the flat portion of the second filling layer and filling the plurality of second grooves, respectively, the second filling layer having a smaller refractive index than a refractive index of the second lens pattern layer, wherein
each of the plurality of first grooves and each of the plurality of second grooves are in a form of a stripe, and
the plurality of first grooves and the plurality of second grooves are filled with the first filling layer and the second filling layer, respectively, the first filling layer and the second filling layer being a transparent material, such that
light rays incident to the first surface of the second lens pattern layer are emitted through the second surface of the second lens pattern layer at various angles in the first direction, according to respective points at which the light rays are incident, and
the light rays emitted from the second surface of the second lens pattern layer and incident to the first surface of the first lens pattern layer are emitted through the second surface of the first lens pattern layer, and at various angles in the second direction, according to respective points at which the light rays are incident.

14. The organic light-emitting display apparatus of claim 13, wherein
the organic light-emitting display panel includes a plurality of emission layers, and
the plurality of emission layers each have a microcavity structure configured to resonate and emit light of a corresponding wavelength.

15. The organic light-emitting display apparatus of claim 13, wherein the first and second filling layers are air or a filler having a smaller refractive index than refractive indexes of the first and second lens pattern layers.

16. The organic light-emitting display apparatus of claim 13, further comprising:
a circular polarization layer on the second lens pattern layer.

17. The organic light-emitting display apparatus of claim 16, further comprising:
a substrate layer between the second lens pattern layer and the circular polarization layer.

18. The organic light-emitting display apparatus of claim 13, wherein a distance between the plurality of emission layers and the first lens pattern layer is less than or equal to about 1.5 mm.

* * * * *